(12) United States Patent
Ng et al.

(10) Patent No.: US 6,410,376 B1
(45) Date of Patent: Jun. 25, 2002

(54) METHOD TO FABRICATE DUAL-METAL CMOS TRANSISTORS FOR SUB-0.1 μM ULSI INTEGRATION

(75) Inventors: Chit Hwei Ng; Chaw Sing Ho, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/797,555

(22) Filed: Mar. 2, 2001

(51) Int. Cl.$^7$ .......................................... H01L 21/8238
(52) U.S. Cl. ....................................... 438/199; 438/183
(58) Field of Search ................................. 438/180, 183, 438/184, 185, 199, 229, 200, 230, 213, 216, 223, 224, 227, 228, 231, 232, 296, 299, 301, 302, 304, 305, 306, 307, 308, 383, 680, 692, 738, 745, 795

(56) References Cited

U.S. PATENT DOCUMENTS

| | | | | |
|---|---|---|---|---|
| 5,731,239 A | * | 3/1998 | Wong et al. | 438/296 |
| 5,786,256 A | | 7/1998 | Gardner et al. | 438/305 |
| 6,001,698 A | | 12/1999 | Kuroda | 438/303 |
| 6,027,961 A | | 2/2000 | Maiti et al. | 438/199 |
| 6,107,130 A | * | 8/2000 | Fulford, Jr. et al. | 438/231 |
| 6,156,593 A | * | 12/2000 | Peng et al. | 438/200 |
| 6,207,482 B1 | * | 3/2001 | Shih et al. | 438/199 |
| 6,214,656 B1 | * | 4/2001 | Liaw | 438/199 |
| 6,265,251 B1 | * | 7/2001 | Jun et al. | 438/183 |

OTHER PUBLICATIONS

Semiconductor International, "Strippers No More: Aqueous Approaches to Residue Removal", pp. 84–86, Dec. 1999.

* cited by examiner

Primary Examiner—David Nelms
Assistant Examiner—David Nhu
(74) Attorney, Agent, or Firm—George O. Saile; Rosemary L. S. Pike

(57) ABSTRACT

A new method for forming a dual-metal gate CMOS transistors is described. An NMOS and a PMOS active area of a semiconductor substrate are separated by isolation regions. A nitride layer is deposited overlying a gate dielectric layer and patterned to form a first dummy gate in each of the active areas. First ions are implanted to form source/drain regions in each of the active areas not covered by the first dummy gates. The first dummy gates are isotropically etched to form second dummy gates thinner than the first dummy gates. Second ions are implanted to form lightly doped source/drain regions in each of the active areas not covered by the second dummy gates. Dielectric spacers are formed on sidewalls of the second dummy gates and the source/drain regions are silicided. A dielectric layer is deposited and planarized to the second dummy gates. Thereafter, the second dummy gates are removed, leaving gate openings in the dielectric layer. A mask is formed over the PMOS active area. A first metal layer is deposited in the gate opening in the NMOS active area and planarized to the mask. The mask is removed. A second metal layer is deposited in the gate opening in the PMOS active area. The first and second metal layers are polished away to the dielectric layer thereby completing formation of dual-metal gate CMOS transistors in the fabrication of an integrated circuit.

34 Claims, 11 Drawing Sheets

METHOD TO FABRICATE DUAL-METAL CMOS TRANSISTORS FOR SUB-0.1 μM ULSI INTEGRATION

BACKGROUND OF THE INVENTION (1) Field of the Invention

The present invention relates to the fabrication of integrated circuit devices, and more particularly, to a method of fabricating dual-metal transistors in the fabrication of integrated circuits.

(2) Description of the Prior Art

For sub-0.1 μm CMOS technology, there are a number of issues. The choice of gate dielectric is one issued that will not be addressed here. Other issues related to the gate stack include:

1) Metal gates are needed to replace conventional polysilicon gates in order to reduce poly depletion effects. Depletion effects translate to a reduction in the electric field across the gate dielectric (Eox) and hence inversion charge density; that is, lower drive current. The effect will become more pronounced with smaller gate geometries due to smaller-energy gate implants which are coupled with ultra-shallow junction formation.

2) Metal gates are needed to replace conventional salicided polysilicon gates. Low gate resistance is difficult to achieve with conventional salicide technology due to the conflicting demands of good junction integrity and low gate resistance. On the source/drain, a silicide thickness of less than 20 nanometers is required when gate geometries reach below 70 nm for low specific contact resistivity. On the other hand, it is expected that the silicide thickness on the gate must be at least 45 nm in order to attain a sheet resistance of less than 5 ohms/sq for low signal propagation delay.

3) Different metals are needed for n+ and p+ gates due to gate work function considerations in order to achieve symmetrically low threshold voltages (for low-power devices such as portables) for the NFETs and PFETs in bulk CMOS.

It is desired to provide a process to address these various concerns.

U.S. Pat. No. 6,027,961 to Maiti et al shows a process for forming PMOS and NMOS gates having different work functions. U.S. Pat. No. 6,001,698 to Kuroda discloses a process for forming CMOS gates using an inverse gate process. U.S. Pat. No. 5,786,256 to Gardner et al shows an inverse polysilicon gate process.

SUMMARY OF THE INVENTION

Accordingly, a primary object of the invention is to provide a process for forming metal gates for CMOS transistors in the fabrication of integrated circuits.

A further object of the invention is to provide a process for forming dual-metal gate CMOS transistors in the fabrication of integrated circuits.

Another object of the invention is to provide a process for forming dual-metal gate CMOS transistors for sub-0.1 μm ULSI integration.

Yet another object of the invention is to provide a process for forming dual-metal gate CMOS transistors with shallow junctions for sub-0.1 μm ULSI integration.

In accordance with the objects of the invention, a method for forming a dual-metal gate CMOS transistors is achieved. An NMOS and a PMOS active area of a semiconductor substrate are separated by isolation regions. A gate dielectric layer is formed overlying the semiconductor substrate in each of the active areas. A nitride layer is deposited overlying the gate dielectric layer and patterned to form a first dummy gate in each of the active areas. First ions are implanted to form source/drain regions in each of the active areas not covered by the first dummy gates. The first dummy gates are isotropically etched to form second dummy gates thinner than the first dummy gates. Second ions are implanted to form lightly doped source/drain regions in each of the active areas not covered by the second dummy gates. Dielectric spacers are formed on sidewalls of the second dummy gates. Thereafter, the source/drain regions are silicided. A dielectric layer is deposited overlying the second dummy gates and silicided source/drain regions and planarized to the second dummy gates. Thereafter, the second dummy gates are removed, leaving gate openings in the dielectric layer. A mask is formed over the PMOS active area. A first metal layer is deposited in the gate opening in the NMOS active area and planarized to the mask. The mask is removed. A second metal layer is deposited in the gate opening in the PMOS active area. The first and second metal layers are polished away to the dielectric layer thereby forming a first metal gate within the gate opening in the NMOS active area and forming a second metal gate within the gate opening in the PMOS active area to complete formation of dual-metal gate CMOS transistors in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
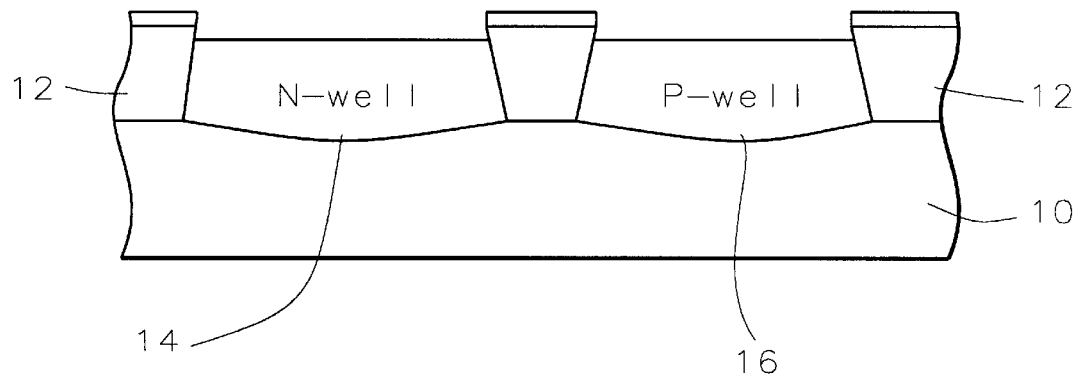
FIGS. 1 through 21 are cross-sectional representations of a preferred embodiment of the present invention.
Figure 2:
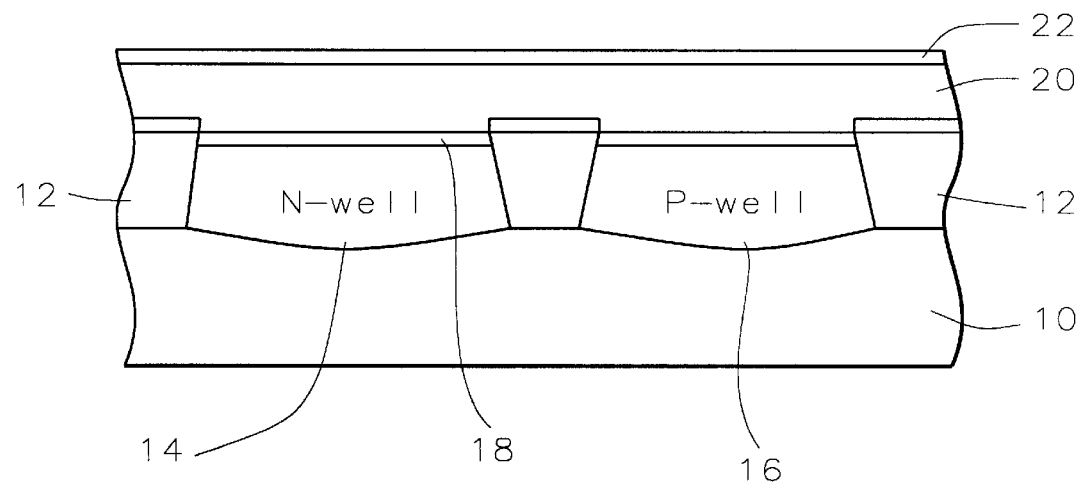

Referring now more particularly to FIG. 1, there is shown a semiconductor substrate 10. This is preferably monocrystalline silicon. Isolation regions, such as shallow trench isolation (STI) 12, are formed in the substrate to separate active regions. N-well 14 and P-well 16 are formed within the substrate, as is conventional. For example, N-well 14 has been formed in an NMOS active area and P-well 16 has been formed in a PMOS active area. Punchthrough and threshold voltage adjustment implantations, not shown, are made as is conventional in the art. Referring now to FIG. 2, a pad oxide layer 18 is grown or deposited over the substrate to a thickness of between about 100 and 150 Angstroms. A nitride layer 20, such as silicon nitride, is deposited over the pad oxide layer 18 to a thickness of between about 2400 and 2600 Angstroms. An additional layer of silicon-rich nitride 22 is deposited over the nitride layer 20 to a thickness of between about 300 and 350 Angstroms.

Figure 3:
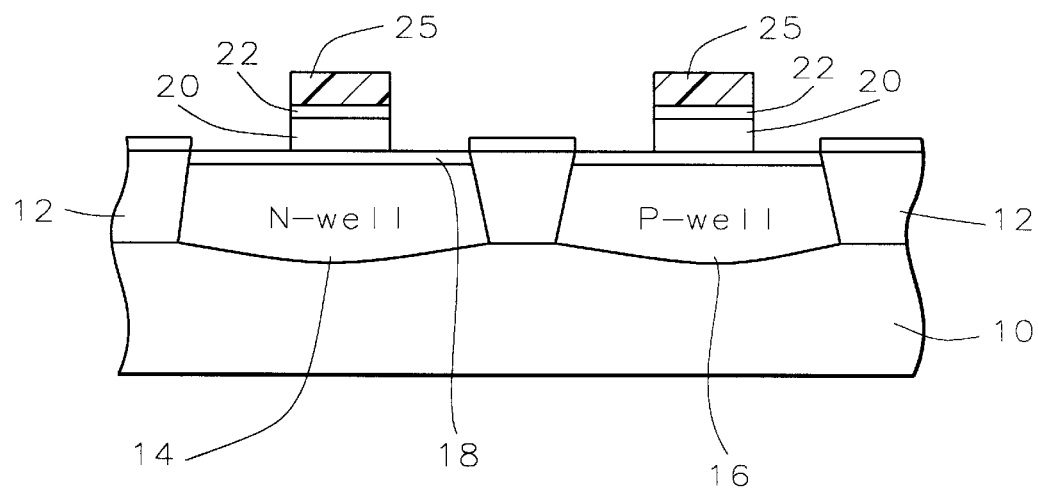

Referring now to FIG. 3, a photoresist mask 25 is formed over the silicon-rich nitride layer 22. The layers 22 and 20 are patterned to form dummy gates, as shown. These dummy gates are larger than the final gates will be, by about 2000 Angstroms.

Figure 4:
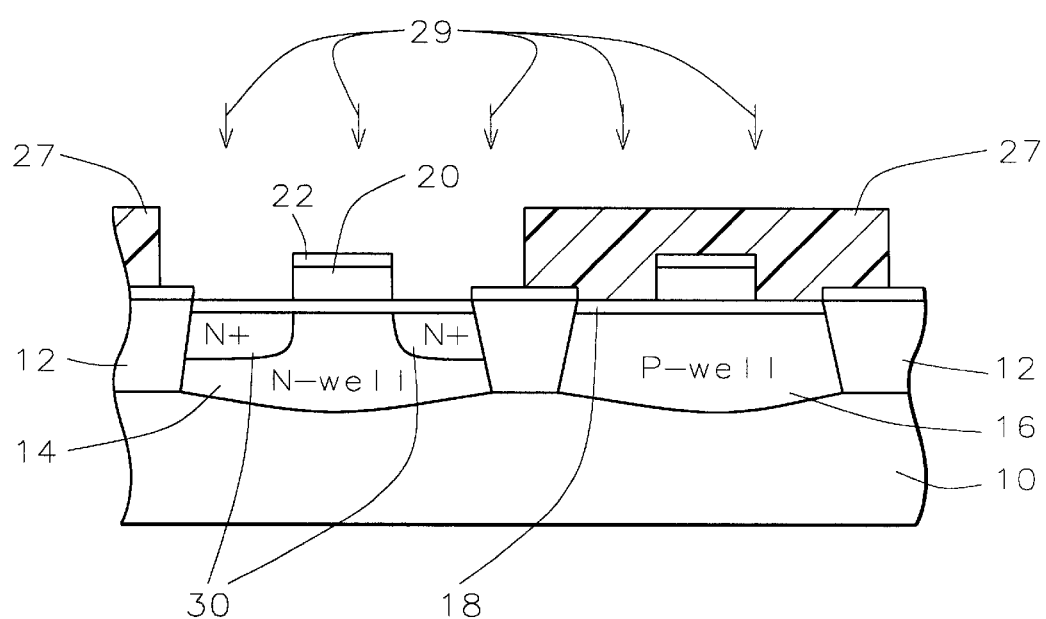

The resist mask 25 is removed. A second mask 27 is formed to shield the PMOS area, as shown in FIG. 4. Ions are implanted 29 into the NMOS active area where they are not blocked by the dummy nitride gate 22/20 to form source/drain regions 30. The mask 27 is removed.

Figure 5:
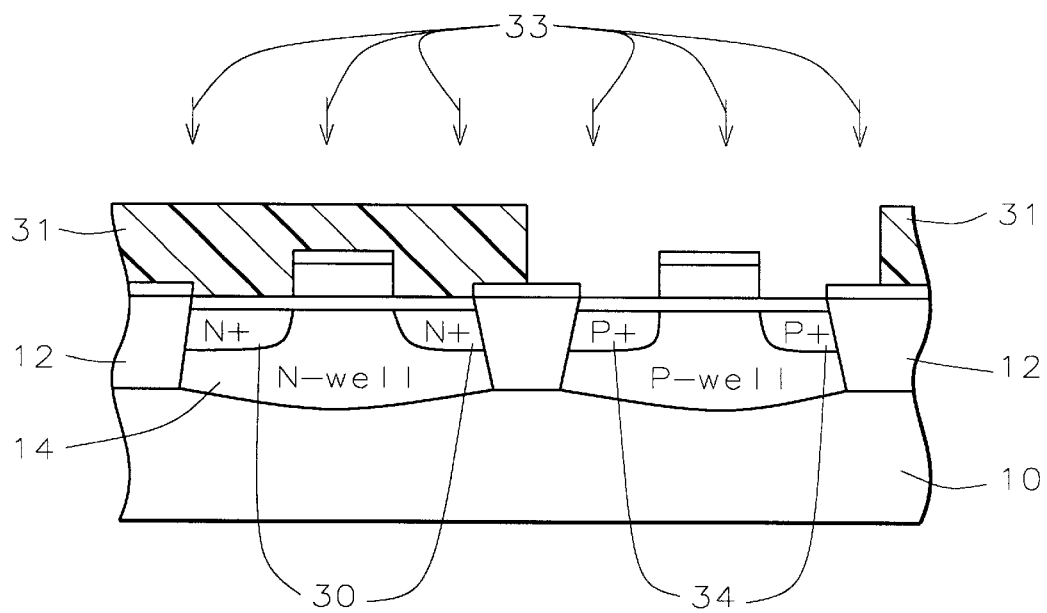

A third mask 31 is formed to shield the NMOS area, as shown in FIG. 5. Ions are implanted 33 into the PMOS active area where they are not blocked by the dummy nitride gate 22/20 to form source/drain regions 34.

Figure 6:
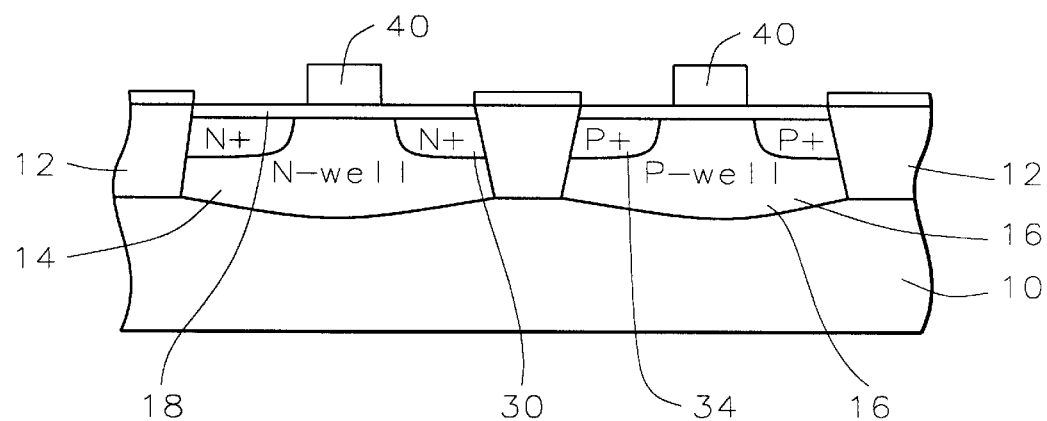

Referring now to FIG. 6, a rapid thermal annealing (RTA) is performed to activate the dopants. The resist mask 31 is stripped. Now, an isotropic chemical wet etch is performed to decrease the width and height of the dummy gates 22/20. The new dummy gates 40 are smaller in width than the old gates 22/20 by 1800 to 2200 Angstroms and are shorter than the old gates by 1800 to 2200 Angstroms (or a by about 17%).

Figure 7:
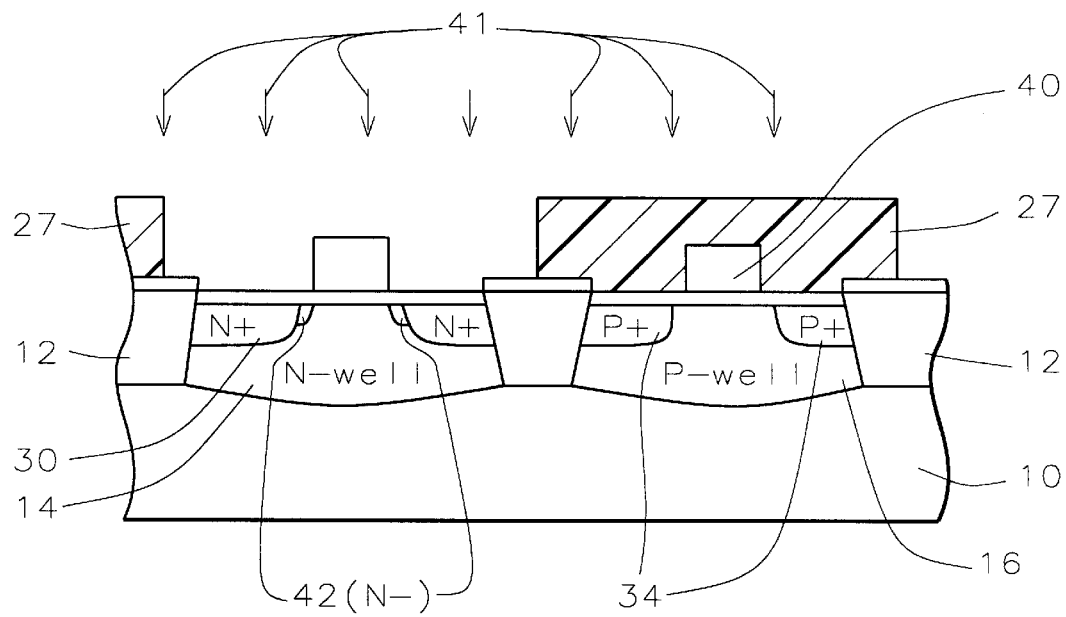

Referring now to FIG. 7, the second mask 27 is again formed to shield the PMOS area. Ions are implanted 41 into the NMOS active area where they are not blocked by the dummy nitride gate 40 to form lightly doped source/drain regions 42. The mask 27 is removed.

Figure 8:
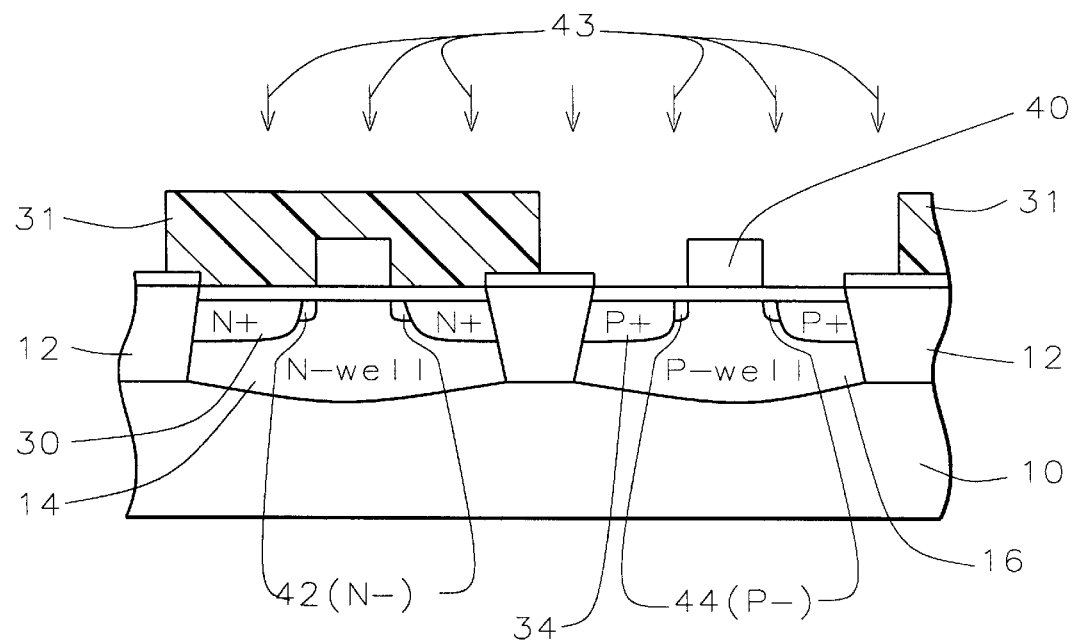

The third mask 31 is again formed to shield the NMOS area, as shown in FIG. 8. Ions are implanted 43 into the PMOS active area where they are not blocked by the dummy nitride gate 40 to form lightly doped source/drain regions 44. The mask 31 is removed.

Figure 9:
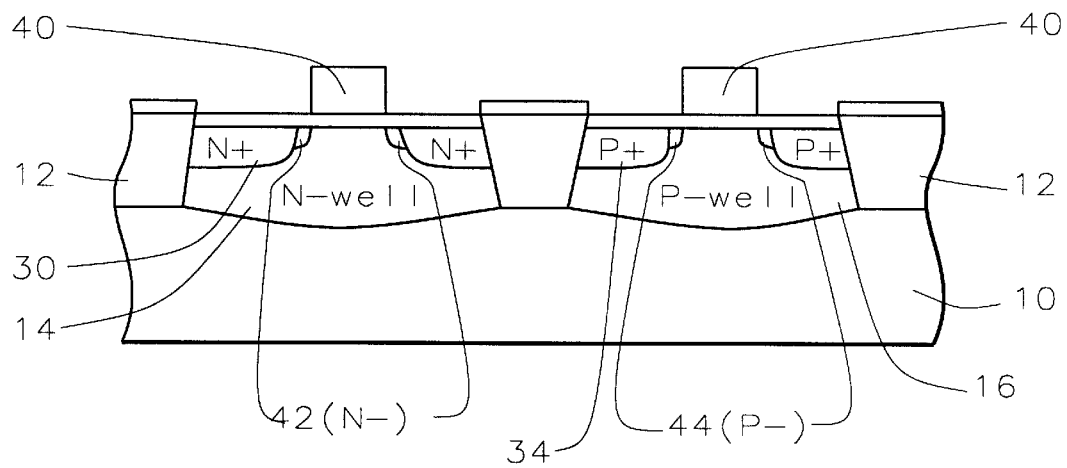

Referring now to FIG. 9, a laser annealing is performed to activate the LDD dopants to form shallow junctions and to reduce lateral diffusion.

This completes formation of the LDD and source/drain. Reversing the LDD and source/drain implantation steps is achieved by the isotropic etching technique applied to the dummy gates. This is important to the formation of a well-controlled shallow junction. The shallow junction is achieved by laser annealing of the LDD dopants after the source/drain RTA anneal, as described above. Alternatively, a single RTA anneal may be performed after the LDD implantation to activate dopants in both LDD and source/drain simultaneously.

Figure 10:
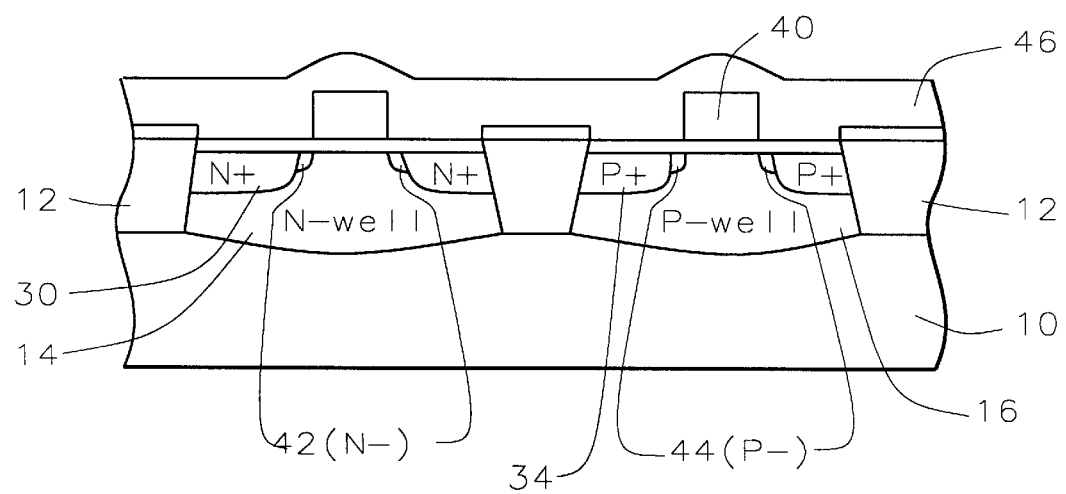
Figure 11:
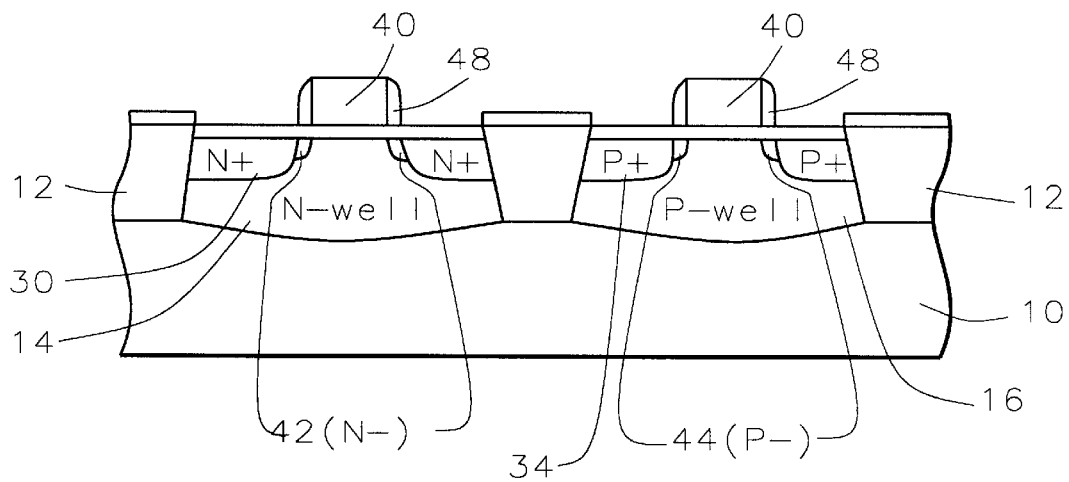

Referring now to FIG. 10, a dielectric layer 46 is deposited over the surface of the substrate and over the dummy gates 40 to a thickness of between about 800 and 1000 Angstroms. The dielectric layer 46 may comprise tetraethoxysilane (TEOS) oxide or a composite layer of TEOS (150 Angstroms) and silicon nitride (850 Angstroms). The dielectric layer 46 is anisotropically etched back to form spacers 48 on the sidewalls of the dummy gates 40, as shown in FIG. 11.

Figure 12:
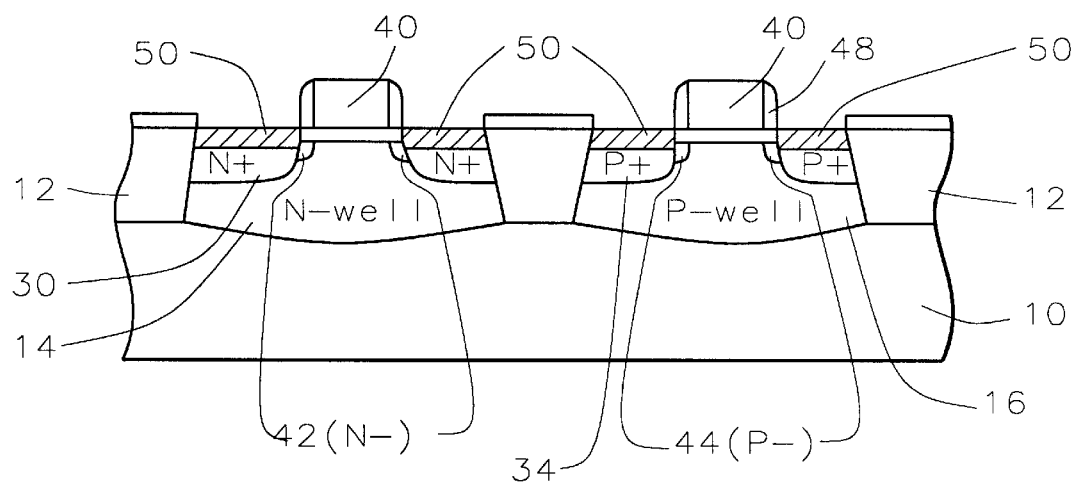

Referring now to FIG. 12, a metal layer is deposited over the substrate. The metal layer may be cobalt, titanium, or nickel. The metal layer is annealed whereby it reacts with the underlying silicon in the source/drain regions to form a metal silicide 50. The unreacted metal layer over the dummy gates is removed. This is a self-aligned silicide (salicide) process. For the nickel silicide process, the thermal budget is measured and the temperature is kept below 600° C.

Figure 13:
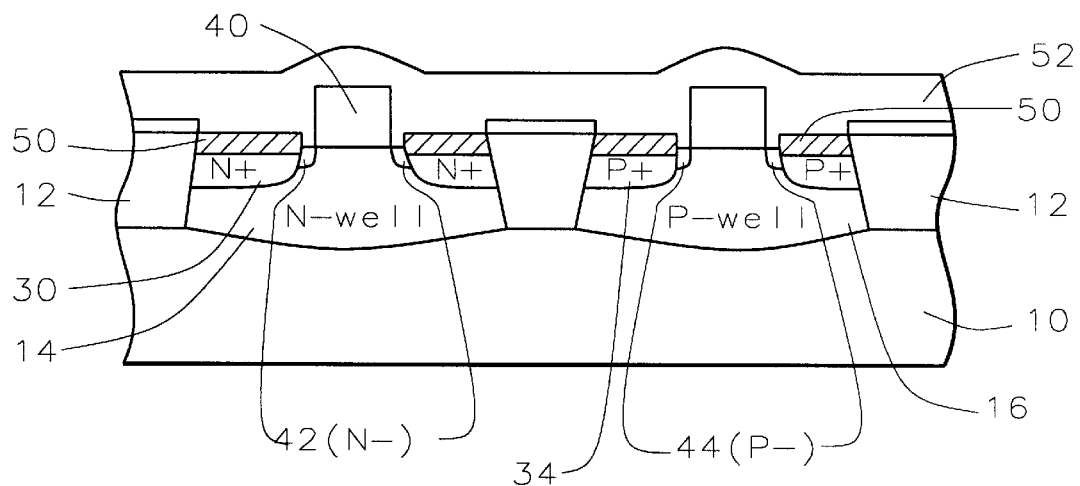
Figure 14:
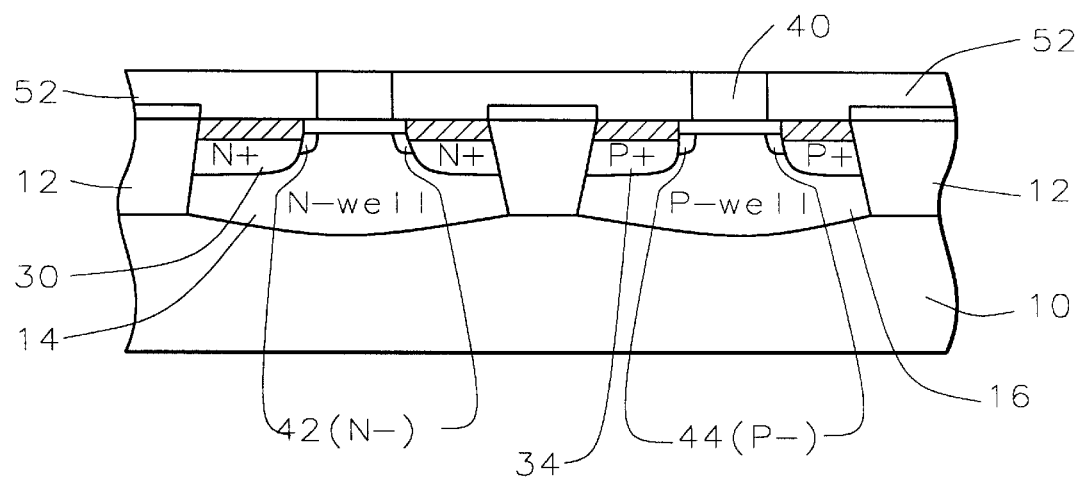

FIG. 13 illustrates the deposition of a second dielectric layer 52. This layer may comprise silicon nitride followed by tetraethoxysilane (TEOS) oxide or borophospho-TEOS (BP-TEOS) and have a thickness of between about 5000 and 6000 Angstroms. The spacers 48 comprise essentially the same material as layer 52 and so are now shown as a part of this layer 52. The layer 52 is planarized by chemical mechanical polishing (CMP) with a polish stop at the dummy nitride gates 40. The planarized layer 52 is shown in FIG. 14.

Figure 15:
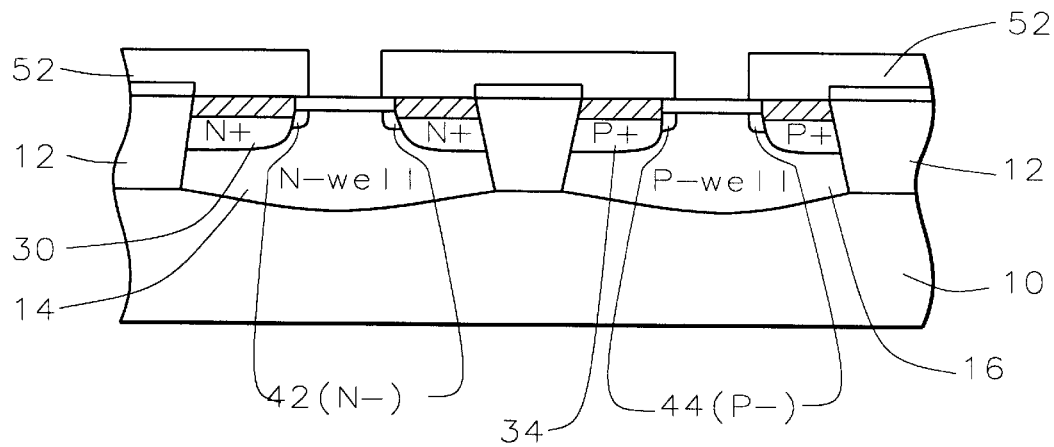

Referring now to FIG. 15, the dummy nitride gates 40 are removed by hot $H_3PO_4$, for example. Now the dual-metal gates of the present invention will be fabricated in the recesses left by the removed dummy gates.

Figure 16:
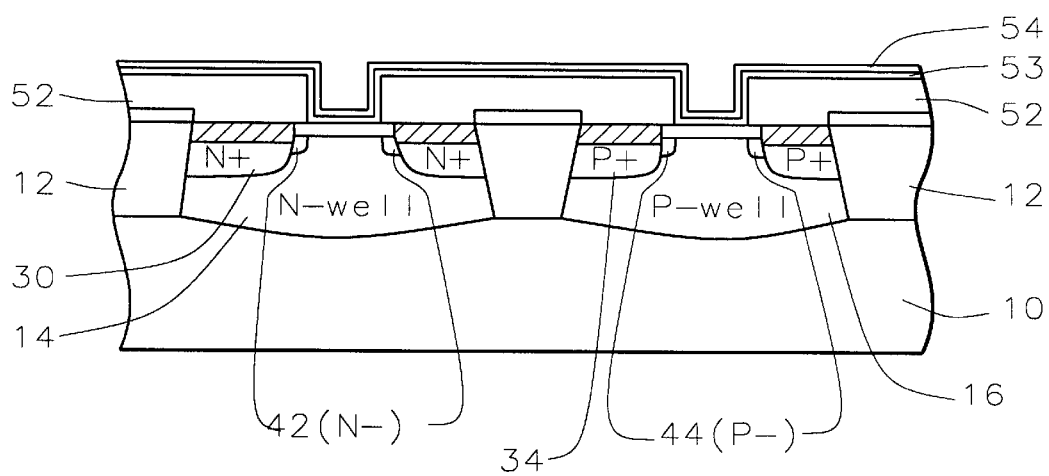

Referring now to FIG. 16, a gate dielectric layer 53 is deposited over the substrate and within the gate openings. This may be zirconium silicate glass deposited by atomic-layer chemical vapor deposition (ALCVD) to a thickness of between about 50 and 100 Angstroms. Next, a diffusion barrier layer 54, such as titanium nitride or tantalum nitride, is deposited by ALCVD to a thickness of between about 150 and 200 Angstroms.

Figure 17:
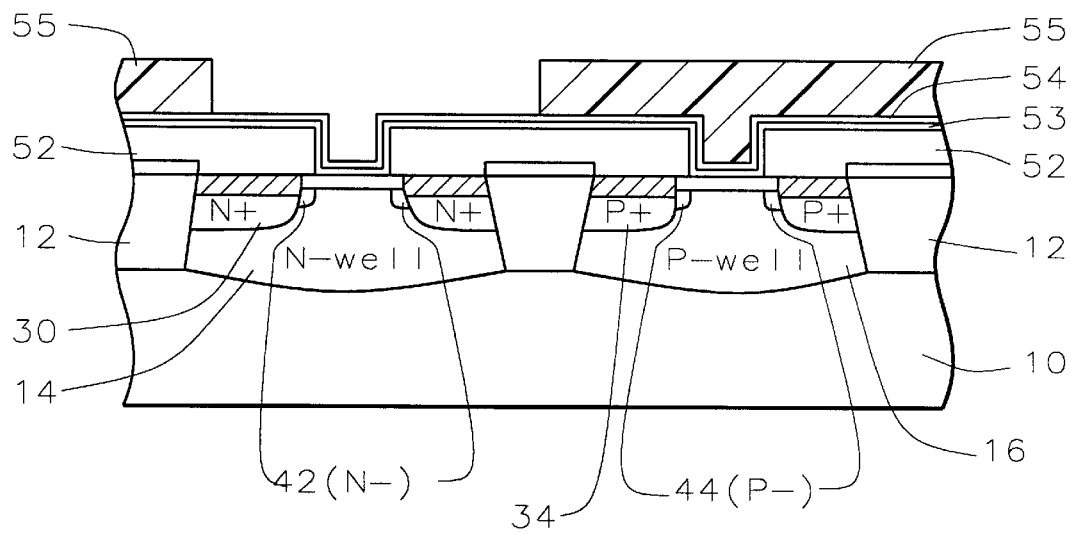
Figure 18:
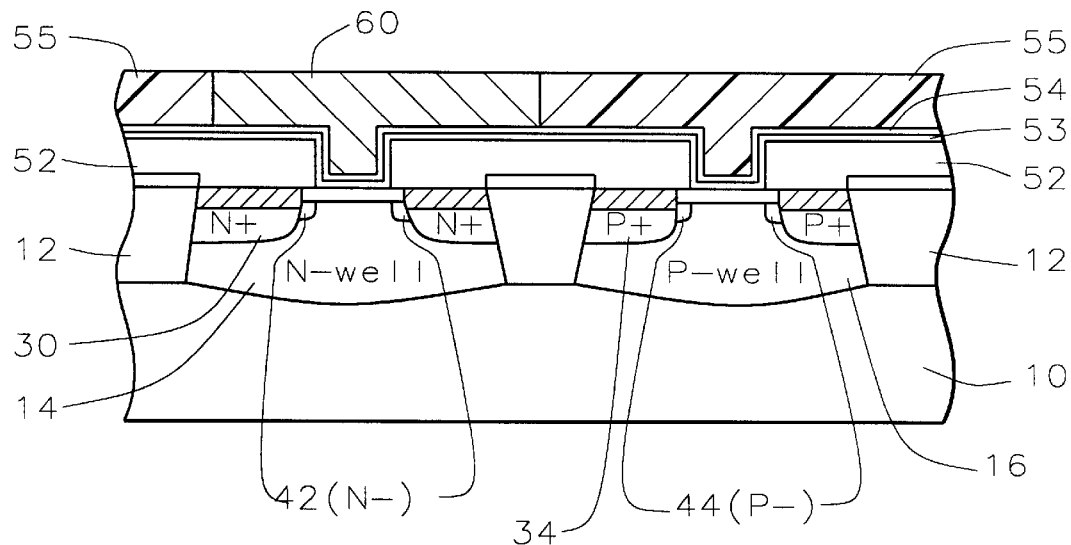

Referring now to FIG. 17, a photoresist layer is deposited over the substrate and patterned to form a mask 55 over the PMOS area, as shown. As shown in FIG. 18, a first metal layer 60, comprising molybdenum, titanium nitride, tungsten, titanium, copper, or silicides, is deposited over the substrate filling the gate opening in the NMOS area. The metal layer 60 is etched back using a plasma etch or polished using CMP to planarize the metal layer, stopping at the photoresist mask 55.

Now the resist mask 55 is removed, for example, using an aqueous solvent such as that reported in "Strippers No More: Aqueous Approaches to Residue Removal" by Laura J. Peters, *Semiconductor International*, December '99, pg. 84–86.

Figure 19:
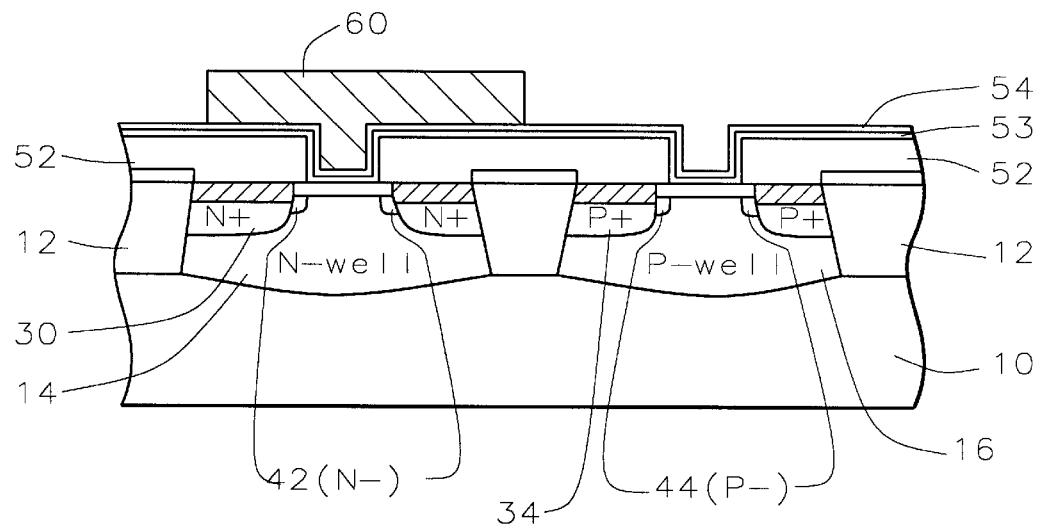
Figure 20:
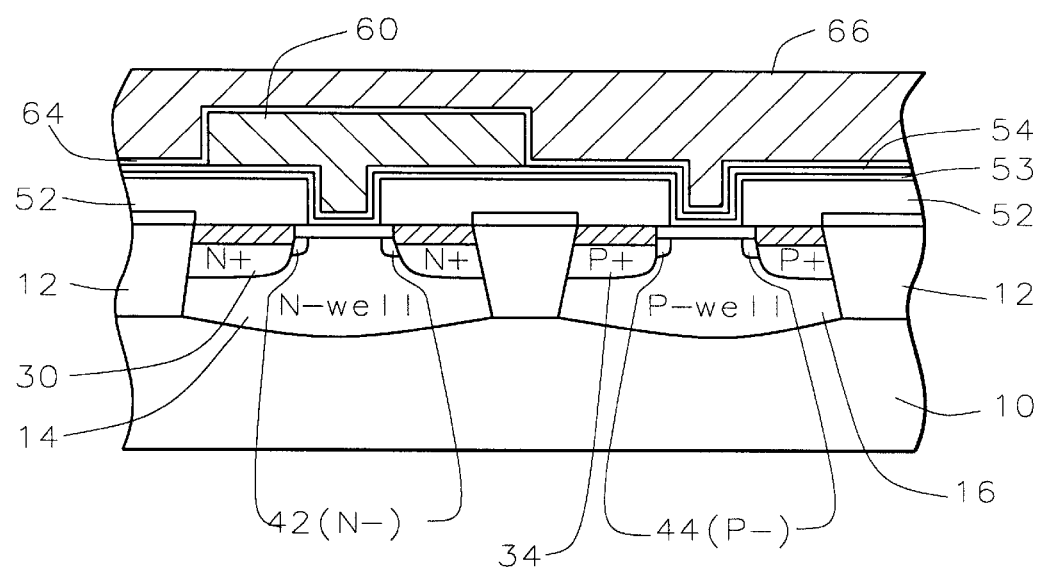

FIG. 19 illustrates the integrated circuit device after the resist has been removed. Now, a second diffusion barrier layer 64 is deposited over the substrate and within the dummy gate opening, as shown in FIG. 20, in case the first diffusion barrier layer 54 has been partially cleaned away during the resist stripping step. The diffusion barrier layer 64 may comprise titanium nitride or tantalum nitride and have a thickness of between about 150 and 200 Angstroms.

Now, a second metal layer 66 is deposited over the second diffusion barrier layer 64. The metal layer 66 may comprise molybdenum, titanium nitride, tungsten, titanium, copper, or silicides. It is important to note that the process of the present invention allows great flexibility in the choice of gate materials. The NMOS and PMOS gates can be made of different metals to optimize each gate.

Figure 21:
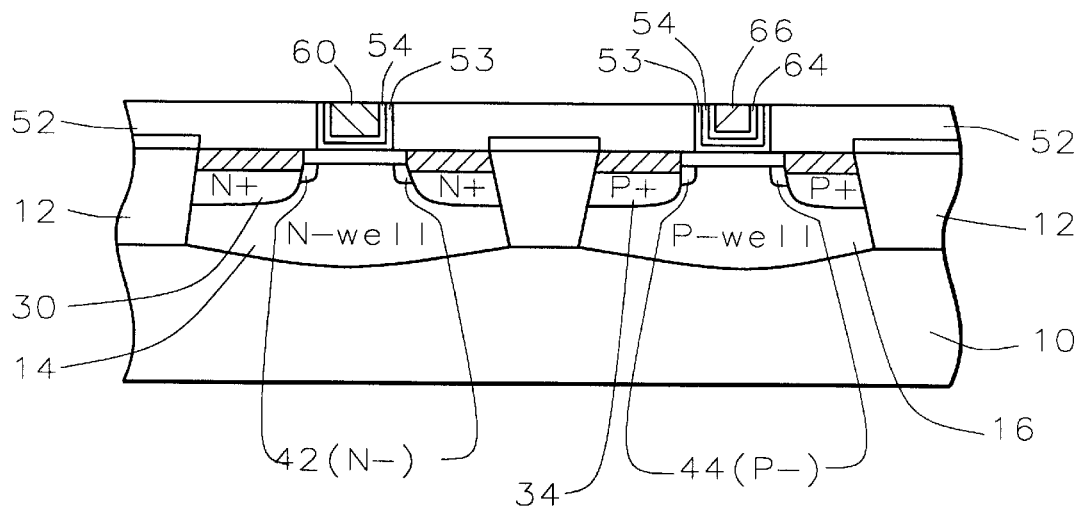

The metal layers are now planarized to the dielectric layer 52, such as by chemical mechanical polishing. This completes the formation of dual-metal gates for CMOS transistors, as shown in FIG. 21.

Figure 22:
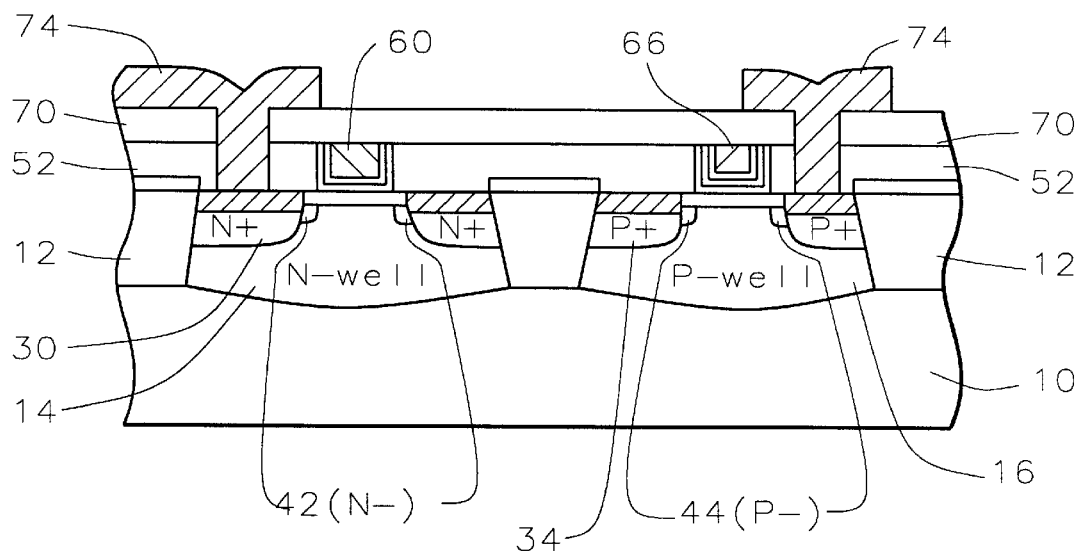
FIG. 22 is a cross-sectional representation of a completed integrated circuit fabricated according to a preferred embodiment of the present invention.

Processing continues to form contacts and back end processing, as is conventional in the art. For example, FIG. 22 illustrates an interlevel dielectric layer 70 covering the metal gates 60 and 66. Openings have been etched through the interlevel dielectric layers, and contacts 74 made, for example, as shown, to the source/drain regions.

The process of the present invention provides a simple, manufacturable dual-metal gate process. The process scheme allows a great flexibility in the choice of gate materials. By a simple isotropic etch technique, the LDD and source/drain implantation steps can be reversed. This is important to the formation of a well-controlled shallow junction.

While the invention has been particularly shown and described with reference to the preferred embodiments thereof, it will be understood by those skilled in the art that various changes in form and details may be made without departing from the spirit and scope of the invention.

What is claimed is:

1. A method of forming dual-metal gate CMOS transistors in the fabrication of integrated circuits comprising:

providing an NMOS active area and a PMOS active area of a semiconductor substrate separated by isolation regions;

forming a pad oxide layer overlying said semiconductor substrate in each of said active areas;

depositing a nitride layer overlying said pad oxide layer;

patterning said nitride layer to form a first dummy gate in each of said active areas;

implanting ions to form source/drain regions in each of said active areas not covered by said first dummy gates;

isotropically etching said first dummy gates to form second dummy gates thinner than said first dummy gates;

implanting ions to form lightly doped source/drain regions in each of said active areas not covered by said second dummy gates;

forming dielectric spacers on sidewalls of said second dummy gates;

thereafter siliciding said source/drain regions;

depositing a dielectric layer overlying said second dummy gates and silicided said source/drain regions and planarizing said dielectric layer to said second dummy gates;

thereafter removing said second dummy gates leaving gate openings in said dielectric layer;

depositing a gate dielectric layer within said gate openings;

depositing a first diffusion barrier layer overlying said gate dielectric layer;

thereafter forming a mask over said PMOS active area;

depositing a first metal layer in said gate opening in said NMOS active area and planarizing said first metal layer to said mask;

thereafter removing said mask;

depositing a second metal layer in said gate opening in said PMOS active area; and polishing away said first and second metal layers to said dielectric layer thereby forming a first metal gate within said gate opening in said NMOS active area and forming a second metal gate within said gate opening in said PMOS active area to complete formation said of dual-metal gate CMOS transistors in the fabrication of an integrated circuit.

2. The method according to claim 1 further comprising forming an N-well in said NMOS active area and forming a P-well in said PMOS active area.

3. The method according to claim 1 wherein said pad oxide layer comprises silicon dioxide and has a thickness of between about 100 and 150 Angstroms.

4. The method according to claim 1 wherein said nitride layer has a thickness of between about 2400 and 2600 Angstroms.

5. The method according to claim 1 further comprising depositing a silicon-rich nitride layer overlying said nitride layer wherein said silicon-rich nitride layer has a thickness of between about 300 and 350 Angstroms.

6. The method according to claim 1 wherein said source/drain ions are activated by a rapid thermal annealing after said source/drain ions are implanted and wherein said lightly doped source/drain ions are activated by a laser annealing after said lightly doped source/drain ions are implanted.

7. The method according to claim 1 wherein said source/drain ions and said lightly doped source/drain ions are activated by a single rapid thermal annealing after said lightly doped source/drain ions are implanted.

8. The method according to claim 1 wherein said step of siliciding said source/drain regions comprises siliciding with one of the group containing cobalt, titanium, and nickel.

9. The method according to claim 1 wherein said dielectric layer comprises tetraethoxysilane (TEOS) oxide having a thickness of between about 5000 and 6000 Angstroms.

10. The method according to claim 1 wherein said step of removing said second dummy gates comprises using hot $H_3PO_4$.

11. The method according to claim 1 wherein said gate dielectric layer comprises zirconium silicate glass and has a thickness of between about 50 and 100 Angstroms.

12. The method according to claim 1 wherein said first diffusion barrier layer comprises one of the group containing titanium nitride and tantalum nitride and has a thickness of between about 150 and 200 Angstroms.

13. The method according to claim 1 further comprising depositing a second diffusion barrier layer overlying said first metal layer and said first diffusion barrier layer within said gate opening in said PMOS active area wherein said second diffusion barrier layer comprises one of the group containing titanium nitride and tantalum nitride and has a thickness of between about 150 and 200 Angstroms.

14. The method according to claim 1 wherein said first and second metal layers may comprise different materials and wherein said materials are selected from the group containing molybdenum, titanium nitride, tungsten, copper, titanium, and silicides.

15. A method of forming dual-metal gate CMOS transistors in the fabrication of integrated circuits comprising:

providing an NMOS active area and a PMOS active area of a semiconductor substrate separated by isolation regions;

forming a pad oxide layer overlying said semiconductor substrate in each of said active areas;

depositing a nitride layer overlying said pad oxide layer;

patterning said nitride layer to form a first dummy gate in each of said active areas;

implanting first ions to form source/drain regions in each of said active areas not covered by said first dummy gates;

isotropically etching said first dummy gates to form second dummy gates thinner than said first dummy gates;

implanting second ions to form lightly doped source/drain regions in each of said active areas not covered by said second dummy gates;

thereafter driving in said first and second ions in a single rapid thermal annealing step;

forming dielectric spacers on sidewalls of said second dummy gates;

thereafter siliciding said source/drain regions;

depositing a dielectric layer overlying said second dummy gates and silicided said source/drain regions and planarizing said dielectric layer to said second dummy gates;

thereafter removing said second dummy gates leaving gate openings in said dielectric layer;

depositing a gate dielectric layer within said gate openings;

depositing a first diffusion barrier layer overlying said gate dielectric layer;

thereafter forming a mask over said PMOS active area;

depositing a first metal layer in said gate opening in said NMOS active area and planarizing said first metal layer to said mask;

thereafter removing said mask;

depositing a second diffusion barrier layer overlying said first metal layer and said first diffusion barrier layer within said gate opening in said PMOS active area;

depositing a second metal layer in said gate opening in said PMOS active area; and polishing away said first and second metal layers to said dielectric layer thereby forming a first metal gate within said gate opening in said NMOS active area and forming a second metal gate within said gate opening in said PMOS active area to complete formation said of dual-metal gate CMOS transistors in the fabrication of an integrated circuit.

16. The method according to claim 15 further comprising forming an N-well in said NMOS active area and forming a P-well in said PMOS active area.

17. The method according to claim 15 wherein said pad oxide layer comprises silicon dioxide and has a thickness of between about 100 and 150 Angstroms.

18. The method according to claim 15 wherein said nitride layer has a thickness of between about 2400 and 2600 Angstroms.

19. The method according to claim 15 further comprising depositing a silicon-rich nitride layer overlying said nitride layer wherein said silicon-rich nitride layer has a thickness of between about 300 and 350 Angstroms.

20. The method according to claim 15 wherein said step of siliciding said source/drain regions comprises siliciding with one of the group containing cobalt, titanium, and nickel.

21. The method according to claim 15 wherein said dielectric layer comprises tetraethoxysilane (TEOS) oxide having a thickness of between about 5000 and 6000 Angstroms.

22. The method according to claim 15 wherein said step of removing said second dummy gates comprises using hot $H_3PO_4$.

23. The method according to claim 15 wherein said gate dielectric layer comprises zirconium silicate glass and has a thickness of between about 50 and 100 Angstroms.

24. The method according to claim 15 wherein said first and second diffusion barrier layers comprise one of the group containing titanium nitride and tantalum nitride and have a thickness of between about 150 and 200 Angstroms.

25. The method according to claim 15 wherein said first and second metal layers may comprise different materials and wherein said materials are selected from the group containing molybdenum, titanium nitride, tungsten, copper, titanium, and silicides.

26. A method of forming dual-metal gate CMOS transistors in the fabrication of integrated circuits comprising:

providing an NMOS active area and a PMOS active area of a semiconductor substrate separated by isolation regions;

forming a pad oxide layer overlying said semiconductor substrate in each of said active areas;

depositing a nitride layer overlying said pad oxide layer;

patterning said nitride layer to form a first dummy gate in each of said active areas;

implanting first ions to form source/drain regions in each of said active areas not covered by said first dummy gates and driving in said first ions using rapid thermal annealing;

isotropically etching said first dummy gates to form second dummy gates thinner than said first dummy gates;

implanting second ions to form lightly doped source/drain regions in each of said active areas not covered by said second dummy gates and driving in said second ions using a laser annealing;

forming dielectric spacers on sidewalls of said second dummy gates;

thereafter siliciding said source/drain regions;

depositing a dielectric layer overlying said second dummy gates and silicided said source/drain regions and planarizing said dielectric layer to said second dummy gates;

thereafter removing said second dummy gates leaving gate openings in said dielectric layer;

depositing a gate dielectric layer within said gate openings;

depositing a first diffusion barrier layer overlying said gate dielectric layer;

thereafter forming a mask over said PMOS active area;

depositing a first metal layer in said gate opening in said NMOS active area and planarizing said first metal layer to said mask;

thereafter removing said mask;

depositing a second diffusion barrier layer overlying said first metal layer and said first diffusion barrier layer within said gate opening in said PMOS active area;

depositing a second metal layer in said gate opening in said PMOS active area;

polishing away said first and second metal layers to said dielectric layer thereby forming a first metal gate within said gate opening in said NMOS active area and forming a second metal gate within said gate opening in said PMOS active area to complete formation said of dual-metal gate CMOS transistors;

depositing an interlevel dielectric layer overlying said first and second metal gates; and etching and filling contact openings through said interlevel dielectric layer to underlying said silicided source/drain regions to complete fabrication of an integrated circuit.

27. The method according to claim 26 further comprising forming an N-well in said NMOS active area and forming a P-well in said PMOS active area.

28. The method according to claim 26 wherein said nitride layer comprises a first silicon nitride layer having a thickness of between about 2400 and 3600 Angstroms and a second silicon-rich nitride layer having a thickness of between about 300 and 350 Angstroms.

29. The method according to claim 26 wherein said step of siliciding said source/drain regions comprises siliciding with one of the group containing cobalt, titanium, and nickel.

30. The method according to claim 26 wherein said dielectric layer comprises tetraethoxysilane (TEOS) oxide having a thickness of between about 5000 and 6000 Angstroms.

31. The method according to claim 26 wherein said step of removing said second dummy gates comprises using hot $H_3PO_4$.

32. The method according to claim 26 wherein said gate dielectric layer comprises zirconium silicate glass and has a thickness of between about 50 and 100 Angstroms.

33. The method according to claim 26 wherein said first and second diffusion barrier layers comprise one of the group containing titanium nitride and tantalum nitride and have a thickness of between about 150 and 200 Angstroms.

34. The method according to claim 26 wherein said first and second metal layers may comprise different materials and wherein said materials are selected from the group containing molybdenum, titanium nitride, tungsten, copper, titanium, and silicides.

* * * * *